United States Patent
Mohammadi et al.

(10) Patent No.: US 11,381,911 B1
(45) Date of Patent: Jul. 5, 2022

(54) DIGITAL SENSOR ASSEMBLY WITH SELECTIVE DYNAMIC ELEMENT MATCHING

(71) Applicant: Knowles Electronics, LLC, Itasca, IL (US)

(72) Inventors: Mohammad Sadegh Mohammadi, Lyngby (DK); Mohammad Shajaan, Copenhagen (DK); Claus Erdmann Furst, Roskilde (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 17/197,026

(22) Filed: Mar. 10, 2021

(51) Int. Cl.
| H04R 3/02 | (2006.01) |
| H03M 3/00 | (2006.01) |
| H04R 19/04 | (2006.01) |
| H04R 3/04 | (2006.01) |

(52) U.S. Cl.
CPC .............. *H04R 3/02* (2013.01); *H03M 3/458* (2013.01); *H03M 3/50* (2013.01); *H04R 3/04* (2013.01); *H04R 19/04* (2013.01); *H04R 2201/003* (2013.01); *H04R 2410/03* (2013.01)

(58) Field of Classification Search
None
See application file for complete search history.

(56) References Cited

U.S. PATENT DOCUMENTS

| 2007/0241950 | A1* | 10/2007 | Petilli | H03M 1/0663 341/143 |
| 2019/0387326 | A1 | 12/2019 | Hansen | |
| 2020/0010315 | A1 | 1/2020 | Tingleff | |

OTHER PUBLICATIONS

Mohammadi, U.S. Appl. No. 17/096,499, U.S. Patent and Trademark Office, filed Nov. 12, 2020.
Pedersen, U.S. Appl. No. 16/874,503, U.S. Patent and Trademark Office, filed May 14, 2020.
Mohammadi, U.S. Appl. No. 17/139,743, U.S. Patent and Trademark Office, filed Dec. 31, 2020.

* cited by examiner

*Primary Examiner* — Kenny H Truong
(74) *Attorney, Agent, or Firm* — Loppnow & Chapa; Matthew C. Loppnow; Roland K. Bowler, II

(57) ABSTRACT

The present disclosure relates generally to digital microphone and other sensor assemblies including a transducer, a delta-sigma analog-to-digital converter (ADC), a dynamic element matching (DELM) entity configured to compensate for nonlinearity resulting from variation among digital-to-analog conversion (DAC) elements of the ADC, and a control circuit configured to enable and disable the DELM based on a magnitude of a digital signal generated by the ADC.

20 Claims, 7 Drawing Sheets

DIGITAL SENSOR ASSEMBLY WITH SELECTIVE DYNAMIC ELEMENT MATCHING

FIELD OF THE DISCLOSURE

The present disclosure relates generally to digital microphone and other sensor assemblies and more particularly to digital sensor assemblies having improved noise performance, and methods therefor.

BACKGROUND

Digital microphones having a transducer that converts sound into an electrical signal conditioned or processed by an integrated circuit are known generally and used in cell phones, personal computers, smart speakers and internet of things (IoT) among other host devices. Such microphones and other sensors often comprise a delta-sigma analog-to-digital converter (ADC) having a digital-to-analog converter (DAC) in a feedback path of the ADC. In these and other DACs, dynamic element matching (DELM) is typically used to compensate for non-linearity caused by mismatch among DAC elements. This mismatch can be attributable to PVT variation and other causes. DELM is typically implemented using data weighted averaging (DWA) algorithm or some other dynamic selection scheme, to perform DAC mismatch shaping. DELM does not include static DAC element selection schemes. A static selection scheme is one where DAC element selection begins at a fixed index (i.e., the same DAC element) for all samples. However, DELM tends to elevate overall noise, which has an adverse effect on the signal-to-noise ratio (SNR). Thus there is a need for noise reduction techniques in digital microphones and other sensor assemblies with low noise and high signal to noise (SNR) requirements.

BRIEF DESCRIPTION OF THE DRAWINGS

The objects, features and advantages of the present disclosure will become more fully apparent from the following detailed description and the appended claims considered in conjunction with the accompanying drawings. The drawings depict only representative embodiments and are therefore not considered to limit the scope of the disclosure.

Those of ordinary skill in the art will appreciate that the figures are illustrated for simplicity and clarity and therefore may not be drawn to scale and may not include well-known features, that the order of occurrence of actions or steps may be different than the order described or be performed concurrently unless specified otherwise, and that the terms and expressions used herein have the meaning understood by those of ordinary skill in the art except where different meanings are attributed to them herein.

DETAILED DESCRIPTION

The present disclosure relates generally to digital microphone and other sensor assemblies including a transducer and a delta-sigma analog-to-digital converter (ADC) with digital-to-analog converter (DAC) element mismatch shaping and more particularly to sensor assemblies and electrical circuits therefor comprising dynamic element matching (DELM).

Figure 1:
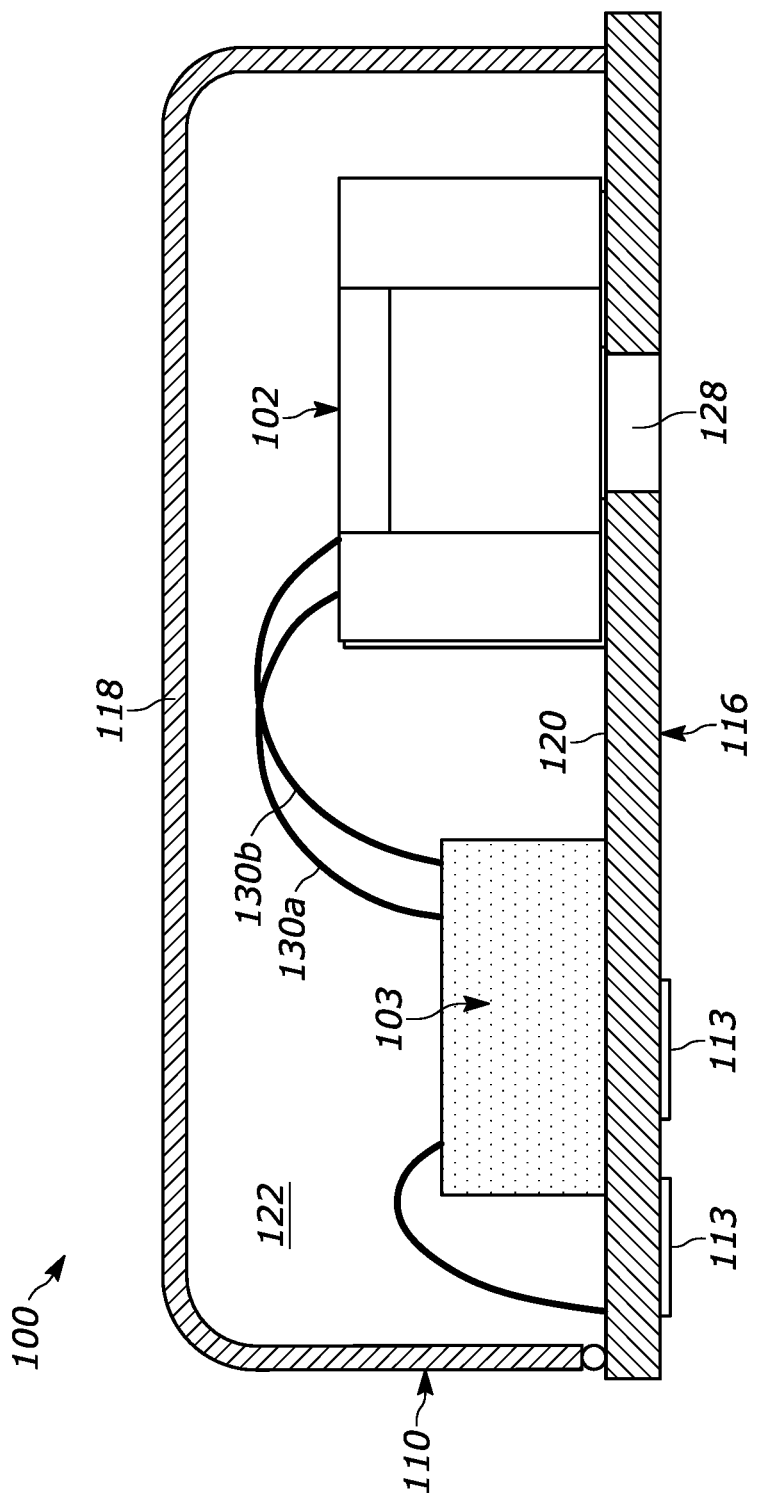
FIG. 1 is a cross-sectional view of a sensor assembly.

The sensor assembly generally comprises a transducer and an electrical circuit disposed in a housing configured to interface with a host device. FIG. 1 is a cross-sectional view of a sensor assembly 100 comprising a transducer 102 coupled to an electrical circuit 103 disposed within a housing 110. The housing includes a base 116 and a cover 118 fastened to an upper surface 20 of the base. In some implementations, the housing shields the transducer and the electrical circuit located within the interior 122 of the housing from electromagnetic interference like RF noise. For this purpose, the cover can be metal or include a conductive portion electrically coupled to a conductive portion of the base. The housing can also include an electrical interface with contacts (e.g., supply, ground, data, clock, select, etc.) configured to interface with a host device. In FIG. 1, the host-interface is a surface-mount interface 113 located on an outer surface of the base 116 and is suitable for reflow soldering processes. In other embodiments, the host-interface can have some other form factor, like through-hole pins, and the interface can be located on another part of the housing.

In some sensor assemblies, like microphones, the housing includes an aperture (also called a "port") connecting an interior of the housing to the external environment. In FIG. 1, the port 128 is located on the base 116 in alignment with the transducer 102. In other sensors, the port can be on some other part of the housing, like the cover or sidewall. A port is not required in other sensor assemblies, like acoustic vibration sensors and accelerometers, among others.

In one embodiment, the sensor assembly is a microphone configured to generate an electrical signal representative of acoustic signals propagated through the atmosphere and detected by a transducer within the housing. In other embodiments, the sensor assembly is configured to generate an electrical signal representative of vibrations. For example, the sensor assembly can be configured to detect acoustic vibrations propagated through a person's body or an inanimate object. Other sensor assemblies can be configured to detect pressure, acceleration, humidity, or temperature, among other conditions. The transducer can be a capacitive, piezoelectric, optical or other transduction device. These and other transduction devices can be implemented as a microelectromechanical systems (MEMS) device or as some other known or future device.

The electrical circuit generally comprises a processing circuit configured to process the electrical signal produced by the transducer and to provide the processed signal at the host interface of the sensor assembly. In FIG. 1, the electrical circuit 103 is coupled to the transducer 102 via leads 130a and 130b and to contacts on the host-interface 113 via traces in the base for this purpose. The electrical circuit can obtain power, clock and other signals from contacts on the host-interface.

Figure 2:
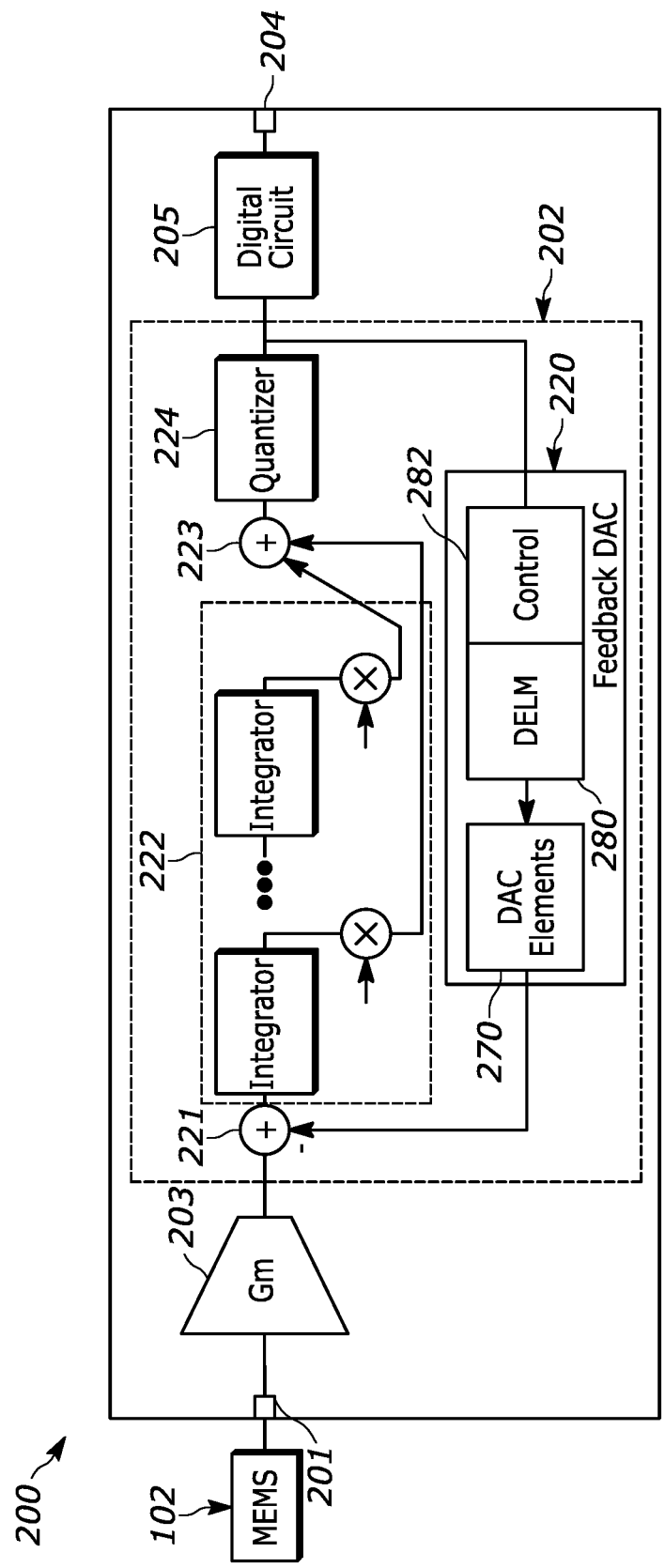
FIG. 2 is a schematic block diagram of a sensor assembly.

The processing circuit comprises a delta-sigma analog-to-digital converter (ADC) including a digital-to-analog converter (DAC) in a feedback path between the output of the ADC and a summer coupled to the input of the ADC. The ADC can be a multi-bit current or voltage delta-sigma modulator. In FIG. 2, the electrical circuit 200 comprises an input terminal 201 (e.g., a transducer interface) coupled to an analog input of a sigma-delta ADC 202 via a summer 221. The feedforward path of the ADC 202 comprises a plurality of cascaded integrator stages 222 having an input coupled to the summer. Each integrator stage has an output coupled to a downstream integrator and to a quantizer 224. A digital output of the quantizer is coupled to the output terminal 204. The ADC also comprises a DAC 220 in a feedback path between the output of the quantizer and the summer. The DAC comprises a plurality of DAC elements 270 and is configured to generate a feedback signal using a subset of DAC elements. The number of DAC elements in the subset is based on a magnitude of the digital signal from the quantizer. The feedback signal is input to the summer and combined with an electrical signal from the transducer, wherein the summer inputs a difference signal to the ADC.

In some embodiments, the processing circuit optionally includes a signal conditioning circuit between the transducer and the ADC. In FIG. 2, the conditioning circuit is a transconductance amplifier 203 having a voltage input and a current output. Alternatively, the amplifier can have a voltage input and a voltage output. Generally, the signal conditioning circuit can include a low noise amplifier, a buffer, a filter or some combination of these and other signal conditioning circuits. The processing circuit can also optionally include a digital circuit 205 between the digital output of the quantizer 224 and the output terminal 204. The digital circuit processes the digital signal output by the ADC. In one implementation, the digital circuit is configured to format the digital signal for a particular digital protocol like PDM or Soundwire, among others. Alternatively, the electrical circuit can output a PCM format signal at the output terminal. The electrical circuit can also include other circuit elements, depending on the transducer type and the particular sensor configuration, some of which are described herein. The electrical circuit can be implemented as one or more integrated circuits (ICs). Such ICs can include, for example, an application specific integrated circuit (ASIC) with analog and/or digital circuits, a digital signal processor (DSP), among other ICs, alone or in combination.

Figure 7:
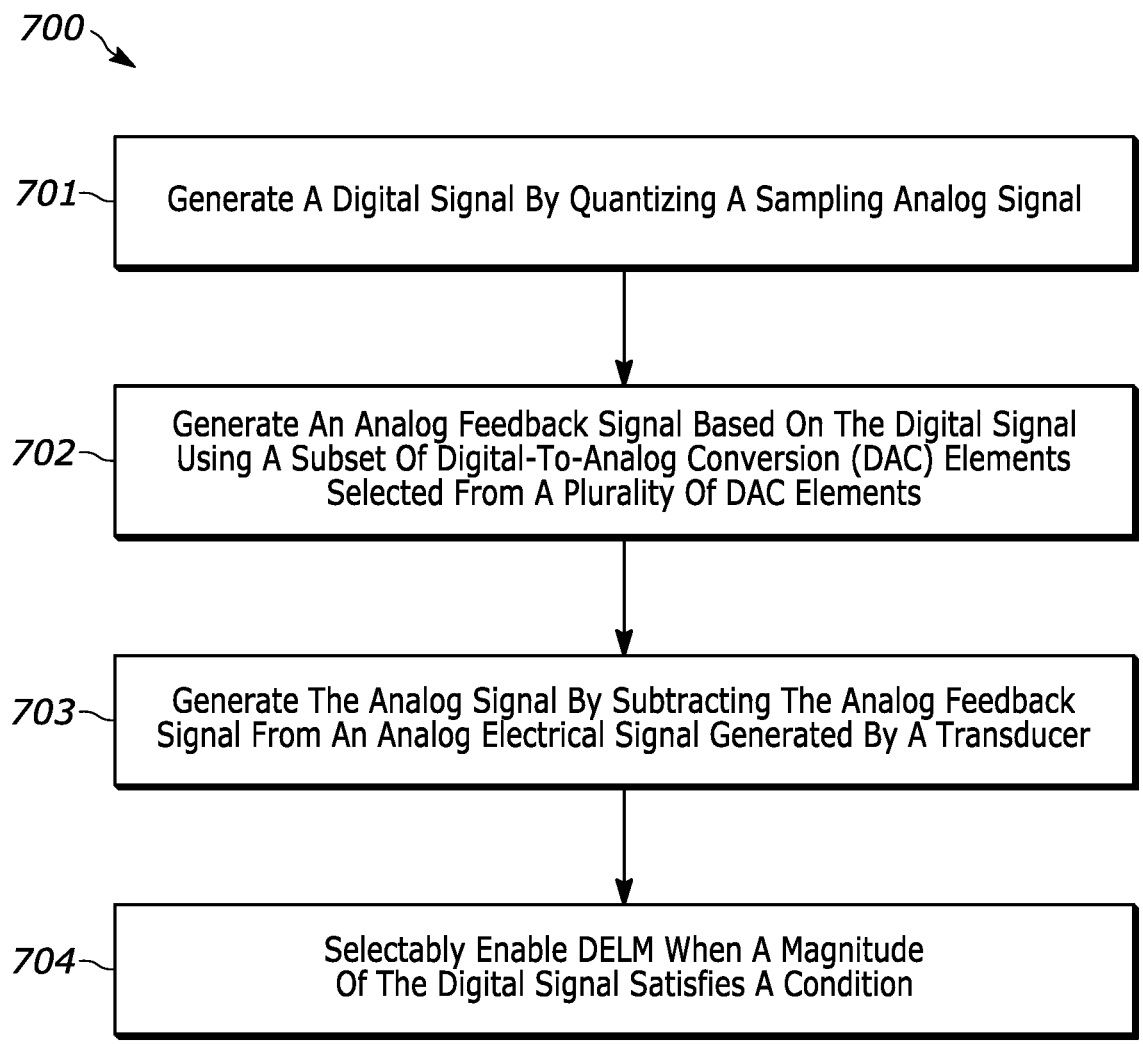
FIG. 7 is a flow diagram of a method of operating a sensor assembly implementing automatically enabled DELM.

In the sensor assembly operational process 700 of FIG. 7, at block 701, the ADC generates a digital signal based on an analog signal received from the transducer. The digital signal is subsequently output at the host-interface of the sensor assembly. At block 702, the DAC generates an analog feedback signal based on the digital signal received from the quantizer using a subset of DAC elements selected using a DAC element scheme described further herein. At block 703, the analog feedback signal generated by the DAC is summed with an analog signal obtained from the transducer and the difference signal is applied to the input of the ADC. As suggested herein, the transducer signal can be conditioned prior to summation.

Figure 3:
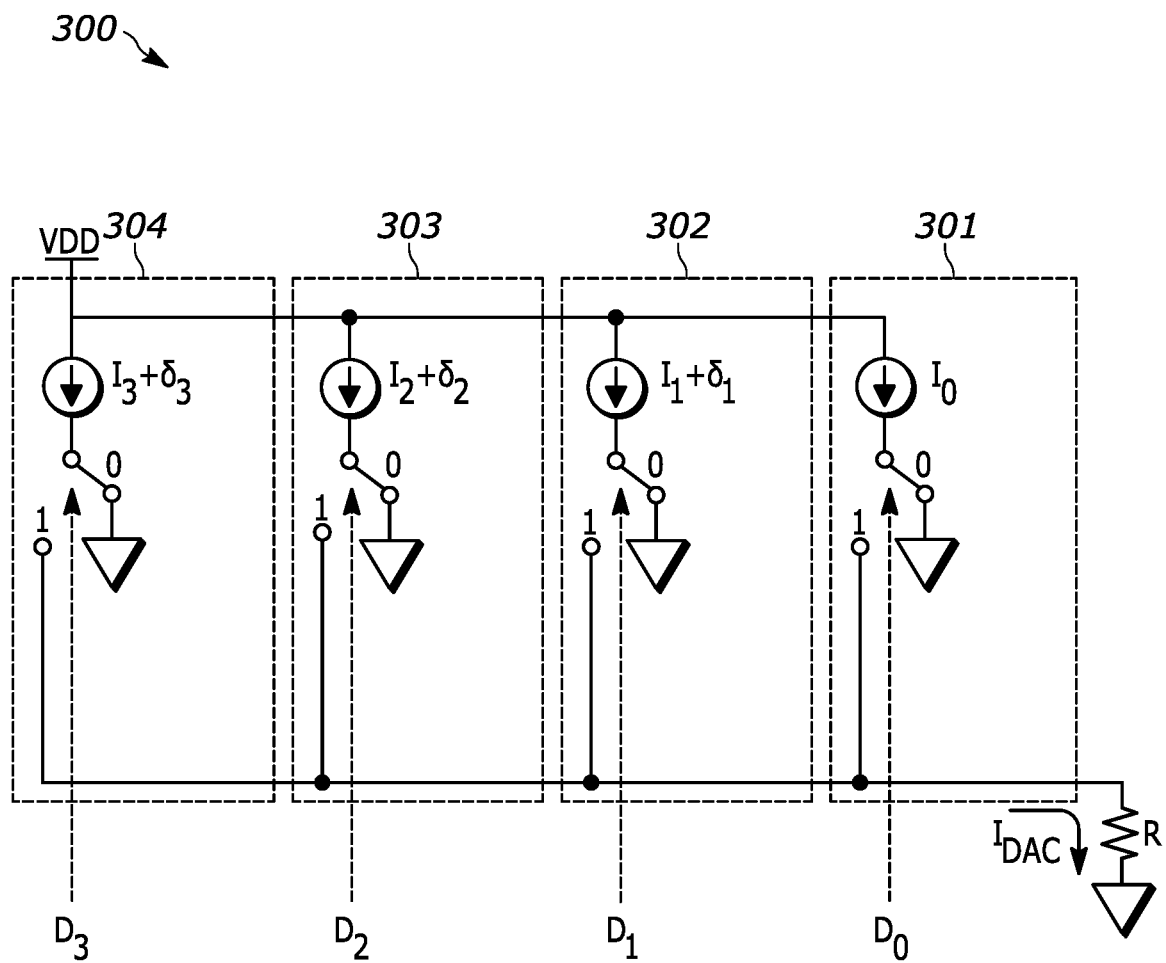
FIG. 3 is a schematic diagram of a multiple digital-to-analog circuit (DAC) elements.

In FIG. 3, representative DAC elements 300 are shown as current elements 301-304 connected in parallel and configured to produce an analog current signal that is combined at the summer 221 with a current output of the transconductance amplifier 203 in FIG. 2. The DAC elements can be current sinks, current sources or both current sources and current sinks. Alternatively, the DAC elements can be voltage elements configured to produce a voltage signal that is combined at the summer with a voltage signal based on an electrical signal generated by the transducer. Generally, there is variation or mismatch among the DAC elements that creates non-linearity or distortion in the feedback signal. In FIG. 3, the variation associated with the Nth DAC element is represented by $\delta_N$.

The electrical circuit also comprises a DELM entity for dynamically selecting a subset of DAC elements for a corresponding digital signal input to the DAC. The number of DAC elements in a particular subset is based on a magnitude of the digital signal. The DELM compensates for non-linearity attributed to mismatch among DAC elements. The DELM can be implemented by any algorithm or other construct that dynamically selects subsets of DAC elements. Mismatch shaping algorithms based on data weighted averaging (DWA) among other known and future dynamic DAC element selection schemes are suitable for this purpose. In FIG. 2, the DAC 220 includes a plurality of DAC elements 270, a DELM entity 280 for dynamically selecting subsets of DAC elements, and a control circuit 282 coupled to the output of the ADC and configured to selectively enable DELM as further described herein.

The inventors have recognized, and simulation results substantiate, that non-linear error attributable to mismatch among DAC elements is relatively low at low digital signal magnitudes, that noise and total harmonic distortion (THD) generally increase with increasing amounts mismatch among DAC elements, and that noise and THD produced when DELM is enabled exceed noise and THD produced when DELM is not enabled for digital signals having relatively low magnitude. In a microphone, sound pressure is proportional to the magnitude of the digital signal. Thus lower sound pressures correlate with lower digital signal magnitudes and vice-versa. In other sensor assemblies, the magnitude of the digital signal is similarly proportional to vibration, temperature, humidity, acceleration, etc., depending on the sensor type.

Figure 4A:
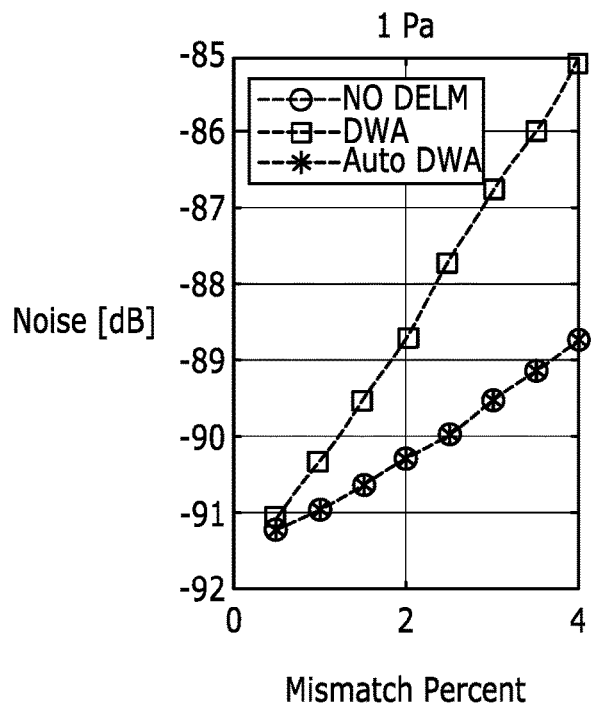
FIGS. 4A-4D illustrate simulated noise versus DAC mismatch percent for various sound pressures.
Figure 4B:
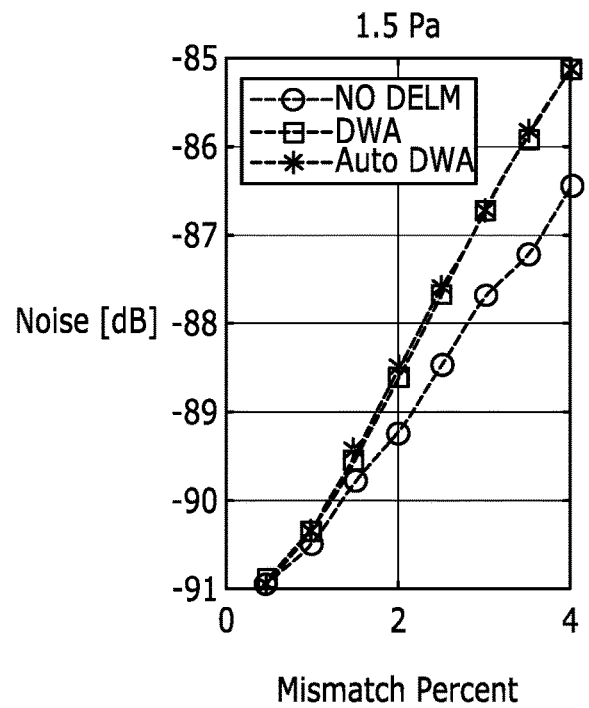
Figure 4C:
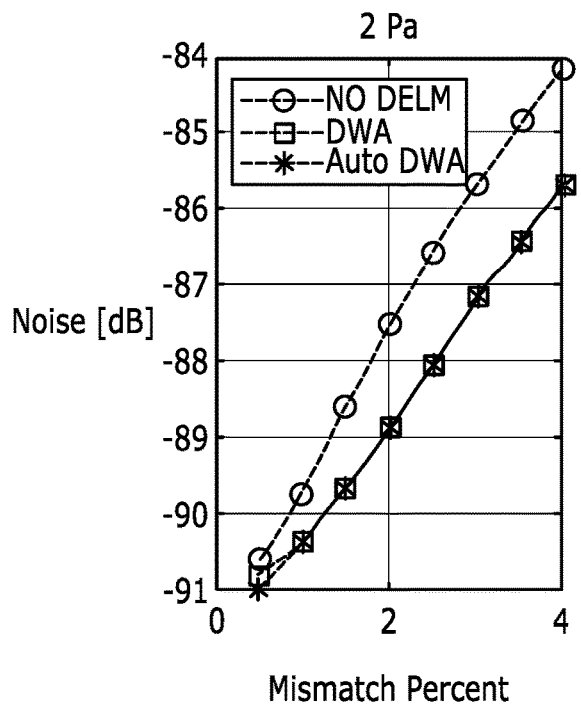
Figure 4D:
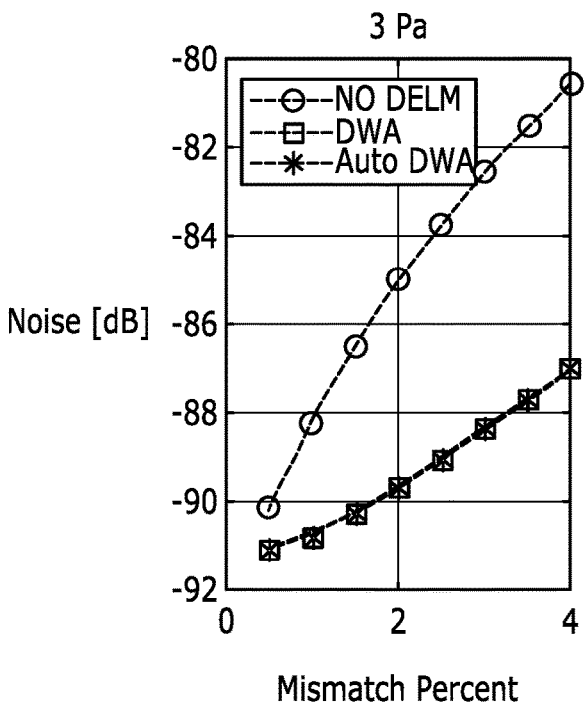

FIGS. 4A-4D illustrate simulated noise versus DAC element mismatch percent for various microphone sound pressures, shown in Pascals (Pa), at 1 kHz when DWA-based DELM ("SWA" plot) is enabled and disabled ("No DELM" plot). FIGS. 4A-4D also show that noise generally increases as the mismatch percentage increases. In FIGS. 4A and 4B, for sound pressures of 1 Pa and 1.5 Pa, noise is greater when DELM is enabled compared to when DELM is disabled. In FIGS. 4C and 4D, for sound pressures of 2 Pa and 3 Pa, noise is less when DELM is enabled compared to when DELM is disabled.

Figure 5A:
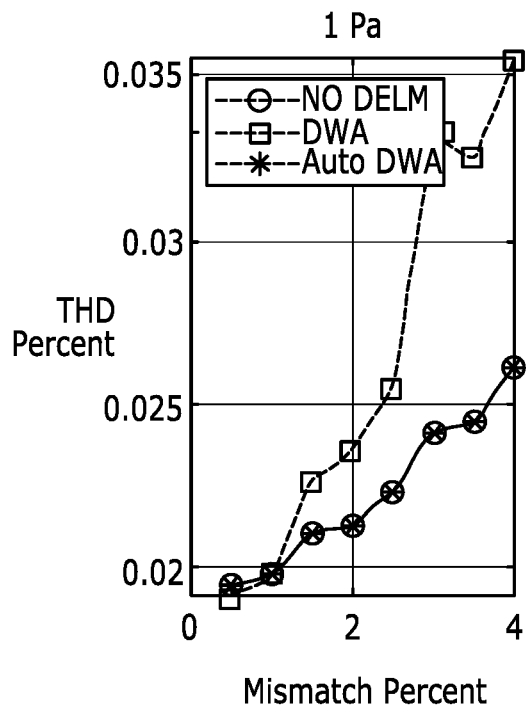
FIGS. 5A-5D illustrate simulated THD versus DAC mismatch percent for various sound pressures.
Figure 5B:
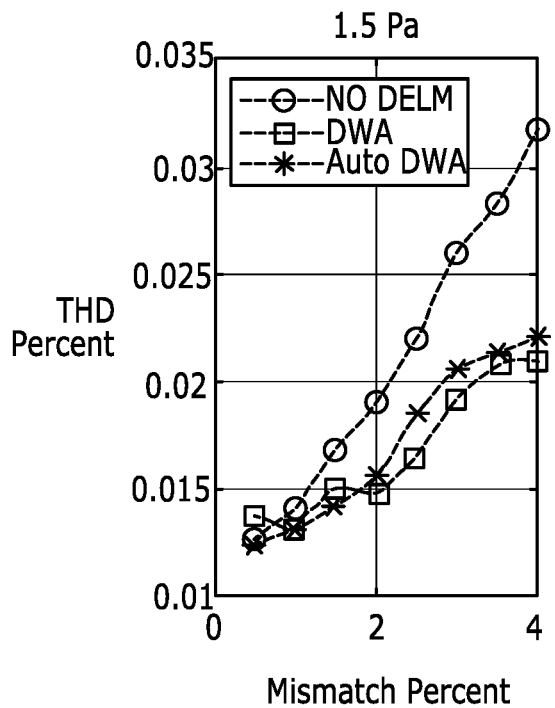
Figure 5C:
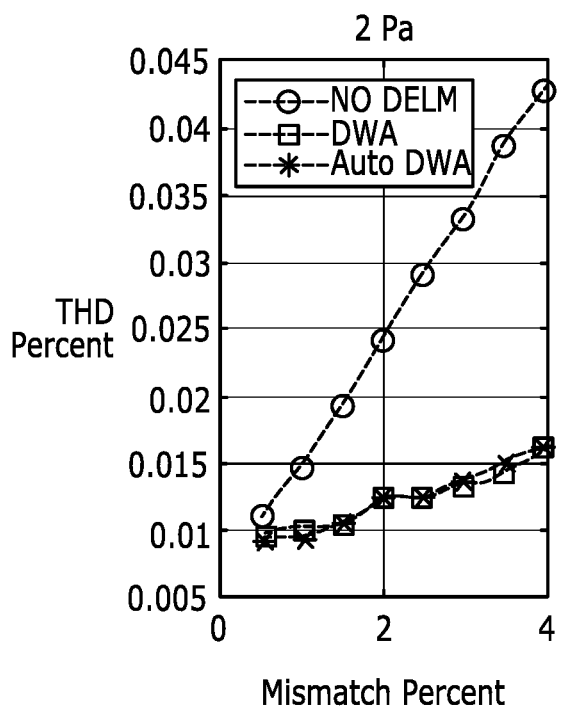
Figure 5D:
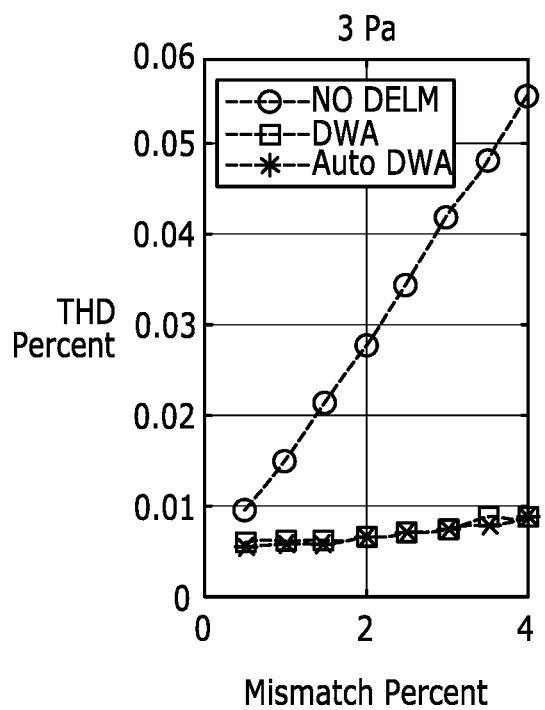

FIGS. 5A-4D illustrate simulated total harmonic distortion (THD) versus DAC element mismatch percent for various microphone sound pressures, shown in Pascals (Pa), at 1 kHz when DWA-based DELM (SWA) is enabled and when DELM is Disabled (No DELM). FIGS. 5A-5D also show that THD generally increases as the percentage of mismatch increases. In FIG. 5A, THD is greater when DELM is enabled compared to when DELM is disabled for a sound pressure of 1 Pa. In FIGS. 5B-5D, THD is less when DELM is enabled compared to when DELM is disabled for sound pressures of 1.5 Pa, 2 Pa and 3 Pa.

According to one aspect of the disclosure, DELM is selectively enabled only when the benefits (e.g., reduced distortion) attributed to DELM outweigh adverse effects (e.g., noise) attributed to DELM. The precise threshold for which DELM is enabled for a particular sensor assembly can be determined empirically or through simulation, depending on sensor performance objectives. Control of DELM can be implemented using programmable logic implemented as a programmable controller, discrete logic circuit, or as a combination thereof, examples of which are described herein.

In the microphone example of FIGS. 5A-5D, "Auto DWA" plots THD when DWA-based DELM is controlled (i.e., enabled and disabled) automatically. In FIG. 5A, DELM is disabled and THD is depicted by the "Auto DWA" plot corresponding to the "No DELM" plot. As sound pressure increases, THD can be reduced by enabling DELM somewhere between 1 Pa and 1.5 Pa. The precise pressure at which DELM is enabled can be determined empirically or by simulation. In FIGS. 5B-5D, DELM is enabled and THD is depicted by the "Auto DWA" plots corresponding substantially to the "DWA" plots. Variation among the "Auto DWA" and "DWA" plots, shown for example in FIG. 5B, is attributable to delay associated with determining whether the magnitude of the digital signal satisfies the condition necessary for disabling DELM.

FIGS. 4A-4D depict noise when DWA-based DELM is disabled and enabled according to FIGS. 5A-5D. In FIG. 4A, DELM is disabled and noise is depicted by the "Auto DWA" plot corresponding to the "No DELM" plot. In FIG. 4B, DELM is enabled and noise is depicted by the "Auto DWA" plot corresponding to the "DWA" plot. The increased noise attributed to the enabled DELM in FIG. 4B is a trade-off to obtain the reduction in THD shown in FIG. 5B. In other implementations, tradeoff between noise and THD can be different, depending the application requirements and use case. In FIGS. 4C-4D, DELM is disabled and noise is depicted by the "Auto DWA" plots corresponding to the respective "DWA" plots.

In FIG. 2, the control circuit 282 is configured to control the DELM entity 280 based on a magnitude of the digital signal. Generally, DELM is enabled when the magnitude satisfies a condition and DELM is disabled when the magnitude of the digital signal does not satisfy the condition. In FIG. 7, at 704, the ADC selectively controls DELM when the magnitude of the digital signal satisfies a condition.

Figure 6:
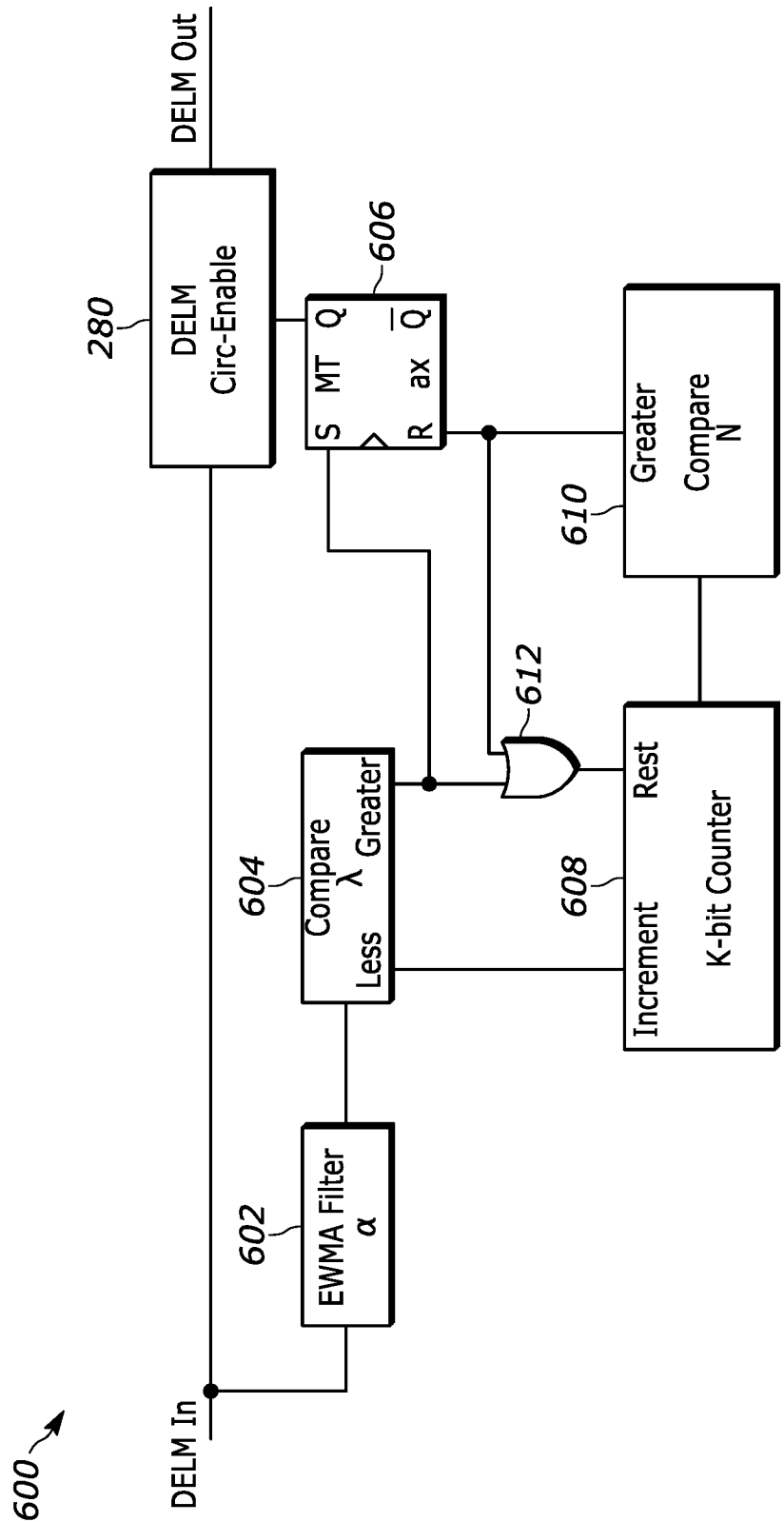
FIG. 6 represents a DELM control circuit.

FIG. 6 is a select control circuit 600 for automatically enabling and disabling DELM. The control circuit generally comprises a reconstruction low pass filter 602 configured to filter the digital signal output by the quantizer. An output of the low pass filter is indicative of a magnitude of the digital signal. In one implementation, the low pass filter is an infinite impulse response (IIR) filter. In another implementation, the low pass filter is an exponentially weighted moving average (EWMA) IIR filter. The parameter alpha ($\alpha$) has a value between 0 and 1 and defines the cut-off frequency of the low pass filter.

In FIG. 6, the control circuit 600 also comprises a comparator 604 configured to compare the output of the low pass filter to a reference threshold ($\lambda$). Generally, DELM is enabled and disabled based on the comparison. In one implementation, DELM is enabled when the low pass filter output exceeds the reference threshold and DELM is disabled when the low pass filter output does not exceed the reference threshold. DELM can be enabled, disabled or neither when the magnitude is equal to the reference threshold. The comparator generates one or more output signals that can control DELM depending on the particular implementation of the control circuit.

In one implementation, the control circuit comprises logic configured to enable DELM based on the comparison by the comparator. In FIG. 6, sequential logic 606 is coupled to a first output of the comparator 604, wherein the first output indicates whether the digital signal satisfies the condition for enabling DELM. In this implementation, DELM is enabled when the sequential logic is set (e.g., input S=1 and output Q=1). DELM can be disabled when the sequential logic is reset (e.g., input R=1 and output Q=0). The logic reset input can be obtained from a second output of the comparator. Alternatively, DELM can be controlled by a logic circuit that requires only a single output from the comparator 604 or by an algorithm implemented in firmware or software and executable by a programmable processor or controller.

The control circuit can also be configured to delay enabling or disabling DELM until after the magnitude of the digital signal does or does not satisfy the condition for a specified time or a specified number of sample periods. In FIG. 6, the control circuit comprises a counter 608 configured to increment a count value for each sample period during which the output of the low pass filter does not satisfy the condition for enabling DELM. For this purpose, the counter 608 is coupled to the comparator 604 and the counter 608 is configured to increment the count value when the output of the low pass filter does not exceed the reference threshold. The control circuit includes a second comparator 610 that compares the count value of the counter to a reference count N. The second comparator is coupled to, and configured to reset, the sequential logic 606 when the count value exceeds the reference count N. According to this implementation, the sequential logic 606 disables the DELM only after the count value attains a predetermined value.

The control circuit also comprises counter reset logic configured to reset the counter 608 when DELM is enabled and when DELM is disabled. In FIG. 6, the counter 608 is reset when the sequential logic 606 is set and reset. For this purpose, rest logic 3012 is coupled to the first output of comparator 604 and to the output of the comparator 610, wherein the counter 608 is reset by a set or reset signal sent to the sequential logic 606. Alternatively, counter 608 can be some other logic circuit or by an algorithm implemented in firmware or software and executable by a programmable processor or controller.

In one implementation, the sensor assembly is a microphone assembly, the low pass filter has a cutoff frequency in the audio frequency band, and the transducer is a micro-electromechanical systems (MEMS) device. In this and other sensor assemblies, the delta-sigma ADC can be configured to quantize an oversampled analog electrical signal generated by the transducer and shift noise outside a frequency band of interest, like the audio band for the case of a microphone.

While the disclosure and what is presently considered to be the best mode thereof has been described in a manner establishing possession and enabling those of ordinary skill in the art to make and use the same, it will be understood and appreciated that there are many equivalents to the select embodiments described herein and that myriad modifications and variations may be made thereto without departing from the scope and spirit of the invention, which is to be limited not by the embodiments described but by the appended claims and their equivalents.

What is claimed is:

1. A digital sensor assembly comprising:
   a transducer configured to generate an electrical signal;
   a delta-sigma analog-to-digital converter (ADC) comprising a forward path having an input coupled to the transducer, and a feedback path having a digital-to-analog converter (DAC) including a plurality of DAC elements,
   the ADC configured to output, for a corresponding sample period, a digital signal based on the electrical signal;
   a dynamic element matching (DELM) entity coupled to an output of the forward path and to the DAC, the DELM entity configured to compensate for nonlinearity resulting from variation among the plurality of DAC elements; and
   a control circuit coupled to the output of the ADC and configured to enable and disable the DELM entity based on a magnitude of the digital signal.

2. The sensor assembly of claim 1, the control circuit configured to enable the DELM entity when a magnitude of the digital signal exceeds a reference threshold, and the control circuit configured to disable the DELM entity when the magnitude of the digital signal does not exceed the reference threshold for a specified number of sample periods.

3. The sensor assembly of claim 1, the control circuit comprising a low-pass filter configured to filter the digital signal, an output of the low pass filter indicative of a magnitude of the digital signal, and a comparator configured to compare the output of the low pass filter to a reference threshold, wherein the control circuit enables and disables the DELM entity based on the comparison.

4. The sensor assembly of claim 3, the control circuit further comprising sequential logic configured to enable and disable the DELM entity based on the comparison, wherein the sequential logic enables the DELM entity when the output of the low pass filter exceeds the reference threshold.

5. The sensor assembly of claim 4, the control circuit further comprising a counter configured to increment a count value for each sample period during which the output of the low pass filter does not exceed the reference threshold, wherein the sequential logic disables the DELM and the counter is reset when the count value exceeds a reference count.

6. The sensor assembly of claim 5, the control circuit further comprising counter reset logic coupled to the counter and configured to reset the counter when the count value exceeds the reference count, wherein the sequential logic is set when the output of the low pass filter exceeds the reference threshold and the sequential logic is reset when the count value exceeds the reference count.

7. The sensor assembly of claim 6 is an acoustic sensor assembly, the low pass filter has a cutoff frequency in the audio frequency band, and the transducer is a microelectromechanical systems (MEMS) device.

8. The sensor assembly of claim 7, wherein the ADC is configured to quantize an oversampled analog electrical signal generated by the transducer and shift noise outside the audio frequency band.

9. A sensor signal processing circuit for interfacing with a transducer, the sensor signal processing circuit comprising:
   a multi-bit delta-sigma analog-to-digital converter (ADC) comprising a forward path having an input connectable to the transducer, and a feedback path having a digital-to-analog converter (DAC) including a plurality of DAC elements,
   the ADC configured to output, for a corresponding sample period, a digital signal based on an electrical signal generated by the transducer when the sensor signal processing circuit is interfaced with the transducer;
   a dynamic element matching (DELM) entity coupled to an output of the forward path and the DAC, the DELM entity configured to compensate for nonlinearity resulting from variation among the plurality of DAC elements; and
   a control circuit coupled to the output of the ADC and configured to enable and disable the DELM based on a magnitude of the digital signal.

10. The sensor signal processing circuit of claim 9, the control circuit configured to immediately enable the DELM entity when a magnitude of the digital signal exceeds a reference threshold, and the control circuit configured to disable the DELM entity when the magnitude of the digital signal does not exceed the reference threshold for a specified number of sample periods.

11. The sensor signal processing circuit of claim 10, the control circuit comprising a reconstruction low pass filter coupled to the output of the forward path and configured to filter the digital signal, and a comparator configured to compare an output of the low pass filter to a reference threshold, wherein the control circuit enables and disables the DELM based on the comparison.

12. The sensor signal processing circuit of claim 11, the control circuit further comprising sequential logic configured to enable and disable the DELM entity based on the comparison, wherein the sequential logic enables the DELM when the output of the low pass filter exceeds the reference threshold.

13. The sensor signal processing circuit of claim 12, the control circuit further comprising a counter configured to increment a count value for each sample period during which the output of the low pass filter does not exceed the reference threshold, wherein the sequential logic disables the DELM and the counter is reset when the count value exceeds a count threshold.

14. The sensor signal processing circuit of claim 13, the control circuit further comprising counter reset logic coupled to the counter and configured to reset the counter when the count value exceeds the count threshold, wherein the sequential logic is set when the output of the low pass filter exceeds the reference threshold and the sequential logic is reset when the count value exceeds a reference count.

15. The sensor signal processing circuit of claim 14, wherein the ADC is configured to quantize an oversampled analog electrical signal generated by the transducer, and shift noise outside a frequency band of interest.

16. The sensor signal processing circuit of claim 9 in combination with a microelectromechanical systems (MEMS) transducer.

17. A method of operating a sensor assembly comprising a multi-bit delta-sigma analog-to-digital converter (ADC) coupled to a transducer, the method comprising:
   generating a digital signal, for a corresponding sample period, by quantizing a sampled analog signal input to the ADC;
   generating an analog feedback signal based on the digital signal using a subset of digital-to-analog converter (DAC) elements selected from a plurality of DAC elements of the ADC;
   providing the analog signal input to the ADC by subtracting the analog feedback signal from an analog electrical signal generated by the transducer; and
   selectively compensating for nonlinearity resulting from variation among the selected DAC elements by enabling dynamic element matching (DELM) when a magnitude of the digital signal satisfies a condition,
   wherein the DELM is not enabled when the magnitude of the digital signal does not satisfy the condition.

18. The method of claim 17 further comprising determining whether the magnitude of the digital signal satisfies the condition by comparing an infinite impulse filter (IIR) response of the digital signal to a reference threshold.

19. The method of claim 18 further comprising disabling DELM when the magnitude of the digital signal does not exceed the reference threshold for a predetermined number of sequential sample periods.

20. The method of claim 18 further comprising oversampling the analog electrical signal generated by the transducer before quantizing, and noise shaping the digital signal, wherein noise in the digital signal is shifted outside a frequency band of interest.

* * * * *